(12) United States Patent
Suzuki et al.

(10) Patent No.: US 7,799,681 B2
(45) Date of Patent: Sep. 21, 2010

(54) METHOD FOR FORMING A RUTHENIUM METAL CAP LAYER

(75) Inventors: Kenji Suzuki, Guilderland, NY (US);
Frank M. Cerio, Jr., Albany, NY (US);
Miho Jomen, Albany, NY (US); Shigeru Mizuno, Delmar, NY (US); Yasushi Mizusawa, Yamanashi (JP); Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/173,814

(22) Filed: Jul. 15, 2008

(65) Prior Publication Data

US 2010/0015798 A1    Jan. 21, 2010

(51) Int. Cl.
*H01L 21/44* (2006.01)
(52) U.S. Cl. .................... 438/681; 438/687; 438/686; 438/638; 438/653; 257/E21.584; 257/E21.495
(58) Field of Classification Search .................. 438/686, 438/687, 681, 638, 653; 257/E21.584, E21.495
See application file for complete search history.

(56) References Cited

U.S. PATENT DOCUMENTS

| | | | |
|---|---|---|---|
| 4,851,895 A | 7/1989 | Green et al. |
| 4,929,468 A | 5/1990 | Mullendore |
| 4,938,999 A | 7/1990 | Jenkin |
| 5,171,610 A | 12/1992 | Liu |
| 5,372,849 A | 12/1994 | McCormick et al. |
| 6,063,705 A | 5/2000 | Vaartstra |
| 6,074,945 A | 6/2000 | Vaartstra et al. |
| 6,303,809 B1 | 10/2001 | Chi et al. |
| 6,319,832 B1 | 11/2001 | Uhlenbrock et al. |
| 6,420,583 B1 | 7/2002 | Lienhard et al. |
| 6,440,495 B1 | 8/2002 | Wade et al. |
| 6,444,263 B1 | 9/2002 | Paranjpe et al. |

(Continued)

FOREIGN PATENT DOCUMENTS

CA     2206217     11/1998

(Continued)

OTHER PUBLICATIONS

Czekaj, C., et al. Inorganic Chemistry, 1988, 27, p. 8-10.

(Continued)

*Primary Examiner*—Matthew Smith
*Assistant Examiner*—Wilner Jean Baptiste

(57) ABSTRACT

A method for integrating ruthenium (Ru) metal cap layers and modified Ru metal cap layers into copper (Cu) metallization of semiconductor devices to improve electromigration (EM) and stress migration (SM) in bulk Cu metal. In one embodiment, the method includes providing a planarized patterned substrate containing a Cu metal surface and a dielectric layer surface, depositing first Ru metal on the Cu metal surface, and depositing additional Ru metal on the dielectric layer surface, where the amount of the additional Ru metal is less than the amount of the first Ru metal. The method further includes at least substantially removing the additional Ru metal from the dielectric layer surface to improve the selective formation of a Ru metal cap layer on the Cu metal surface. Other embodiments further include incorporating one or more types of modifier elements into the dielectric layer surface, the Cu metal surface, the Ru metal cap layer, or a combination thereof.

24 Claims, 5 Drawing Sheets

U.S. PATENT DOCUMENTS

| | | | |
|---|---|---|---|
| 6,605,735 | B2 | 8/2003 | Kawano et al. |
| 6,713,373 | B1 | 3/2004 | Omstead |
| 6,989,321 | B2 | 1/2006 | Yamasaki et al. |
| 7,107,998 | B2 | 9/2006 | Greer et al. |
| 7,264,846 | B2 | 9/2007 | Chang et al. |
| 7,270,848 | B2 | 9/2007 | Suzuki et al. |
| 7,279,421 | B2 | 10/2007 | Suzuki |
| 7,285,308 | B2 | 10/2007 | Hendrix et al. |
| 7,288,479 | B2 | 10/2007 | Suzuki |
| 7,459,396 | B2 | 12/2008 | Suzuki et al |
| 7,592,257 | B2 | 9/2009 | Ishizaka |
| 2002/0137276 | A1 | 9/2002 | Park |
| 2003/0001278 | A1 | 1/2003 | Kojima |
| 2003/0129306 | A1 | 7/2003 | Wade et al. |
| 2005/0110142 | A1 | 5/2005 | Lane et al. |
| 2006/0113675 | A1 | 6/2006 | Chang et al. |
| 2006/0121733 | A1* | 6/2006 | Kilpela et al. ............... 438/681 |
| 2006/0131751 | A1 | 6/2006 | Minamihaba |
| 2006/0199372 | A1 | 9/2006 | Chung et al. |
| 2006/0273431 | A1 | 12/2006 | He et al. |
| 2007/0059502 | A1 | 3/2007 | Wang et al. |
| 2007/0072415 | A1 | 3/2007 | Suzuki |
| 2007/0082132 | A1 | 4/2007 | Shinriki et al. |
| 2007/0284736 | A1 | 12/2007 | Yang et al. |
| 2008/0075835 | A1 | 3/2008 | Ishizaka et al. |
| 2008/0081464 | A1 | 4/2008 | Matsuda et al. |
| 2008/0315429 | A1 | 12/2008 | McFeely et al. |
| 2009/0280649 | A1 | 11/2009 | Mayer et al. |

FOREIGN PATENT DOCUMENTS

| | | |
|---|---|---|
| EP | 0620291 A1 | 10/1994 |
| JP | 2004146516 | 5/2004 |
| WO | WO 00/12777 | 3/2000 |
| WO | WO0026432 A1 | 5/2000 |
| WO | WO2005034223 A1 | 4/2005 |
| WO | 2006104853 | 10/2006 |

OTHER PUBLICATIONS

Wang et al., Low-temperature chemical vapor deposition and scaling limit of ultrathin Ru films, Applied Physics Letters, Feb. 23, 2004, p. 1380-1382, vol. 84, No. 8, American Institute of Physics, Melville, NY.

Boyd, Edwin P., et al., "Chemical Vapor Deposition of Metallic Thin Films Using Homonuclear and Heteronuclear Metal Carbonyls", Chem. Mater. 1997, 9, pp. 1154-1158.

Green, M.L., et al., "Chemical Vapor Deposition of Ruthenium and Ruthenium Dioxide Films", Journal of the Electrochemical Society, vol. 132, No. 11, pp. 2677-2685.

Cheng, Wei-Yuan, et al., "Initial growth of chemical-vapor-deposited Ru from bis(hexafluoroacetylacetonate)dicarbonyl ruthenium", Thin Solid Films 483 (2005) pp. 31-37.

Gatineau, Julien, et al., "Deposition of highly pure ruthenium thin films with a new metal-organic precursor", Surface and Coatings Technology 201 (2007), pp. 9146-9148.

Bykov, A.F., et al., "Investigation of Thermal Properties of Ruthenium(III) B-Diketonate Precursors for Preparation of RuO2 Films by CVD", Journal of Thermal Analysis, vol. 46 (1996) pp. 1551-1565.

European Patent Office, Internal Search Report and Written Opinion issued Jun. 19, 2009 in related case U.S. Appl. No. 11/853,393, 11 pp.

European Patent Office, Internal Search Report and Written Opinion issued Jun. 19, 2009 in related case U.S. Appl. No. 12/018,074, 15 pp.

United States Patent and Trademark Office, Non-final Office action issued Sep. 3, 2009, in related case U.S. Appl. No. 12/018,074, 21 pp.

European Patent Office, International Search Report and Written Opinion in PCT Application No. PCT/US2005/035582 corresponding to related case U.S. Appl. No. 10/996,145, dated Aug. 8, 2006, 9 pages.

State Intellectual Property Office of the People's Republic of China, First Office Action in Chinese Patent Application No. 200580040103.X corresponding to related case U.S. Appl. No. 10/996,145, dated Feb. 13, 2009, 7 pages.

United States Patent and Trademark Office, Non-final Office Action issued Jul. 20, 2005 in related case U.S. Appl. No. 10/996,145, 11 pages.

United States Patent and Trademark Office, Final Office Action issued Jan. 31, 2006 in related case U.S. Appl. No. 10/996,145, 7 pages.

United States Patent and Trademark Office, Non-Final Office Action issued Sep. 5, 2006 in related case U.S. Appl. No. 10/996,145, 8 pages.

United States Patent and Trademark Office, Non-Final Office Action issued Mar. 25, 2009 in continuation U.S. Appl. No. 11/856,946 of related case U.S. Appl. No. 10/996,145, 12 pages.

International Search Report and Written Opinion in PCT Application No. PCT/US09/58689 corresponding to case U.S. Appl. No. 12/240,894, dated Nov. 16, 2009, 7 pages.

United States Patent and Trademark Office, Non-Final Office Action issued Mar. 2, 2010, in case U.S. Appl. No. 12/240,894, 13 pages.

United States Patent and Trademark Office, Non-Final Office Action issued Apr. 3, 2010, in case U.S. Appl. No. 11/853,393, 7 pages.

United States Patent and Trademark Office, Non-Final Office Action issued Jun. 1, 2010, in case U.S. Appl. No. 11/853,393, 14 pages.

United States Patent and Trademark Office, Final Office Action issued Jun. 29, 2010, in case U.S. Appl. No. 12/240,894, 16 pages.

* cited by examiner

METHOD FOR FORMING A RUTHENIUM METAL CAP LAYER

CROSS REFERENCE TO RELATED APPLICATIONS

The present invention is related to U.S. patent application Ser. No. 11/853,393, entitled METHOD FOR INTEGRATING SELECTIVE RUTHENIUM DEPOSITION INTO MANUFACTURING OF A SEMICONDUCTOR DEVICE. The present invention is related to U.S. patent application Ser. No. 12/018,074, entitled METHOD FOR INTEGRATING SELECTIVE LOW-TEMPERATURE RUTHENIUM DEPOSITION INTO COPPER METALLIZATION OF A SEMICONDUCTOR DEVICE. The entire contents of these applications are incorporated herein by reference. The related applications are commonly-owned.

FIELD OF THE INVENTION

The present invention relates to semiconductor processing and semiconductor devices, and more particularly, to a method of integrating ruthenium (Ru) metal cap layers and Ru-containing cap layers into copper (Cu) metallization of semiconductor devices to improve electromigration (EM) and stress migration (SM) in bulk Cu metal.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of Cu metal in multilayer metallization schemes for manufacturing integrated circuits has created several problems that require solutions. For example, high mobility of Cu atoms in dielectric materials and Si can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node due to decreasing minimum feature sizes. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials which is directly correlated to adhesion at these interfaces. New materials that provide better adhesion and better EM lifetime have been studied extensively. For example, a cobalt-tungsten-phosphorus (CoWP) layer has been selectively deposited on bulk Cu metal using an electroless plating technique. The interface of CoWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal-containing cap layers that provide good adhesion to Cu metal and improved EM and SM properties of bulk Cu metal. In particular, these methods should provide good selectivity for forming the metal-containing cap layers on Cu surfaces compared to dielectric surfaces.

SUMMARY OF THE INVENTION

Embodiments of the invention provide a method for integrating Ru metal cap layers and modified Ru metal cap layers into Cu metallization of semiconductor devices to improve electromigration and stress migration in bulk Cu metal.

According to one embodiment of the invention, the method includes providing a planarized patterned substrate containing a Cu metal layer surface and a dielectric layer surface, depositing first Ru metal on the Cu metal layer surface, and depositing additional Ru metal on the dielectric layer, where the amount of the additional Ru metal is less than the amount of the first Ru metal. The method further includes at least substantially removing the additional Ru metal from the dielectric layer surface to selectively form a Ru metal cap layer on the Cu metal layer surface. According to another embodiment, the method further includes forming a modified Ru metal cap layer and a modified dielectric layer surface by incorporating one or more types of modifier elements into the Ru metal cap layer and the dielectric layer surface, where the one or more types of modifier elements are selected from groups of elements in the Periodic Table of the Elements based on one or more barrier property enhancement parameters associated with the modifier elements.

According to another embodiment of the invention, the method includes providing a planarized patterned substrate containing a Cu metal surface and a dielectric layer surface, forming a modified Cu metal layer surface and a modified dielectric layer surface by incorporating one or more types of modifier elements into the Cu metal layer surface and the dielectric layer surface, where the one or more types of modifier element are selected from groups of elements in the Periodic Table of the Elements based on one or more barrier property enhancement parameters associated with the modifier elements. The method further includes depositing first Ru metal on the modified Cu layer surface, and depositing additional Ru metal on the modified dielectric layer surface, where the amount of the additional Ru metal is less than the amount of the first Ru metal. The method still further includes at least substantially removing the additional Ru metal from the modified dielectric layer surface to selectively form a Ru metal cap layer on the modified Cu metal layer surface. According to another embodiment, the method further includes forming a modified Ru metal cap layer by incorporating one or more types of modifier elements into the Ru metal cap layer, where the one or more types of modifier elements are selected from groups of elements in the Periodic Table of the Elements based on one or more barrier property parameters associated with the modifier elements.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide a method for integrating Ru metal cap layers and modified Ru metal cap layers into Cu metallization of semiconductor devices to improve electromigration (EM) and stress migration (SM) in the devices. The modified Ru metal cap layers can contain modifier elements selected from the Periodic Table of the Elements incorporated into at least a portion of a Ru metal cap layer. One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

Figure 1A:
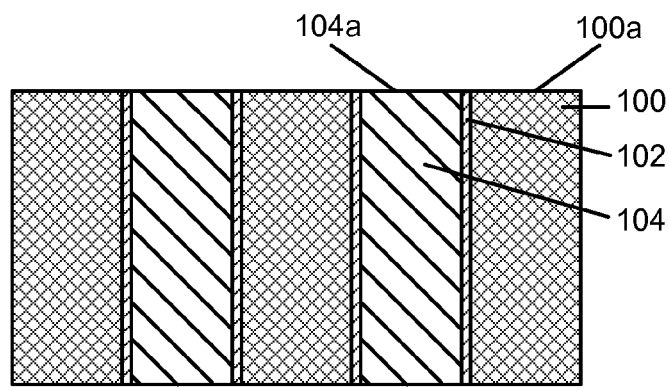
FIGS. 1A-1D show schematic cross-sectional views of formation of a Ru metal cap layer in Cu metallization of a semiconductor device according to one embodiment of the invention.

FIGS. 1A-1D show schematic cross-sectional views of formation of a Ru metal cap layer in Cu metallization of a semiconductor device according to one embodiment of the invention. FIG. 1A shows a patterned substrate containing a plurality of recessed features in a dielectric layer 100, a diffusion barrier layer 102 in a recessed feature, and Cu metal layer 104 filling the recessed feature. The dielectric layer 100 can, for example, contain $SiO_2$, a low dielectric constant (low-k) dielectric material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material, including high dielectric constant (high-k) dielectric materials. The diffusion barrier layer 102 can, for example, contain a tantalum(Ta)-containing layer (e.g., Ta, TaC, TaN, or TaCN, or a combination thereof), a titanium(Ti)-containing layer (e.g., Ti, TiN, or a combination thereof), or a tungsten(W)-containing layer (e.g., W, WN, or a combination thereof). Although not shown in FIG. 1A, an adhesion layer, e.g., a Ru metal layer, may be located between the diffusion barrier layer 102 and the Cu metal layer 104 in the recessed feature.

Still referring to FIG. 1A, the patterned substrate has been planarized to form a Cu metal layer surface 104a and a dielectric layer surface 100a. Cu filling of the recessed feature may be performed by a Cu plating process, for example by an electrochemical plating process or by an electroless plating process, and the planarization may be performed by chemical mechanical polishing (CMP) following the Cu plating process. The CMP process may be optimized for Cu removal with high selectivity to the dielectric layer 100. The planarization removes excess Cu metal from the patterned substrate following the Cu filling process and further removes the diffusion barrier layer 102 from the surface 100a. CMP and Cu plating processes are well known to those skilled in the art.

In FIG. 1A, the patterned substrate may be a part of a damascene interconnect structure containing a high-aspect-ratio recessed feature. The feature can have an aspect ratio (depth/width) greater than or equal to about 2:1, for example 3:1, 4:1, 5:1, 6:1, 12:1, 15:1, or higher. The feature can have a width of about 200 nanometers (nm=$10^{-9}$ m), or less, for example 150 nm, 100 nm, 65 nm, 45 nm, 32 nm, 20 nm, or smaller. However, embodiments of the invention are not limited to these aspect ratios or feature widths, as other aspect ratios and feature widths may be utilized. According to one embodiment of the invention, a dual damascene interconnect structure contains a trench and a via formed in the patterned substrate. It will be understood that embodiments of the invention may be applied to simple and complicated damascene interconnect structures and other types of patterned substrates containing recessed features filled with Cu metal.

Figure 1B:
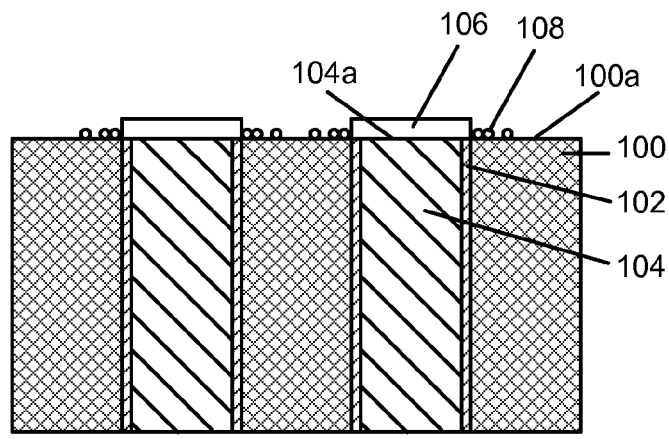

FIG. 1B shows first Ru metal 106 deposited on the Cu metal layer surface 104a and additional Ru metal 108 deposited on the dielectric layer surface 100a. According to one embodiment of the invention, the first Ru metal 106 and the additional Ru metal 108 may be deposited by a thermal chemical vapor deposition (TCVD) process in a process chamber without the use of a plasma using a process gas containing $Ru_3(CO)_{12}$ precursor vapor and CO carrier gas. An exemplary Ru metal CVD process using a $Ru_3(CO)_{12}$ precursor and a CO carrier gas is described U.S. Pat. No. 7,270,848, the contents of which is herein incorporated by reference. In another example, first Ru metal 106 and additional Ru metal 108 may be deposited by a CVD process utilizing a ruthenium metalorganic precursor. Exemplary ruthenium metalorganic precursors include (2,4-dimethylpentadienyl) (ethylcyclopentadienyl)ruthenium (Ru(DMPD)(EtCp)), bis(2,4-dimethylpentadienyl)ruthenium (Ru(DMPD)₂), 4-dimethylpentadienyl) (methylcyclopentadienyl)ruthenium (Ru(DMPD)(MeCp)), and bis(ethylcyclopentadienyl)ruthenium (Ru(EtCp)₂), as well as combinations of these and other precursors.

In one example, an average thickness of the first Ru metal 106 can be between 5 Angstrom ($10^{-10}$ m) and 100 Angstrom, for example about 5, 10, 15, 20, 30, 40, 50, 60, 70, 80, 90, or 100 Angstrom. However, embodiments of the invention are not limited to those first Ru metal 106 thicknesses and thicker first Ru metal 106 may be utilized. For very thin first Ru metal 106, for example about between 5 Angstrom and 20 Angstrom, the surface coverage of the first Ru metal 106 on the Cu metal layer surface 104a may be incomplete or discontinuous with gaps that expose the surface 104a. According to embodiments of the invention, the amount of the additional Ru metal 108 is less than the amount of the first Ru metal 106. According to one embodiment of the invention, an average thickness of the first Ru metal 106 is greater than the average thickness of the additional Ru metal 108. Further, as depicted in FIG. 1B, the surface coverage of the additional Ru metal 108 on the dielectric layer surface 100a may be incomplete or discontinuous with gaps that expose the surface 100a. In other embodiments, the surface coverage of both the first Ru metal 106 and the additional Ru metal 108 may be complete or continuous with no exposed gaps, where the thickness of the first Ru metal 106 is greater than the thickness of the additional Ru metal 108.

As depicted in FIG. 1B, deposition of the first Ru metal 106 on the Cu metal layer surface 104a can be substantially selective relative to the dielectric layer surface 100a. In other words, Ru metal is preferentially deposited on the Cu metal surface 104a compared to on the dielectric layer surface 100a. Therefore, deposition rate of the first Ru metal 106 on the Cu metal layer surface 104a is higher than deposition rate of the additional Ru metal 108 on the dielectric layer surface 100a. Deposition of the additional Ru metal 108 can proceed by loss of deposition selectivity on the Cu metal surface 104a relative to the dielectric layer surface 100a during depositing of the first Ru metal 106. The initial deposition of Ru metal on the patterned substrate may be delayed due to slow nucleation of the Ru metal atoms on the patterned substrate. This time delay is called an incubation time. The Ru metal deposition on the Cu metal layer surface 104a shows much shorter (or zero) incubation time than on the dielectric layer surface 100a. Thus, in theory, first Ru metal 106 may be selectively deposited on the Cu metal layer surface 104a when the deposition is carried out for a duration that is shorter than the incubation time on the dielectric layer surface 100a. Further, if the deposition process is carried out for a duration that is longer than the incubation time on the surface 100a, additional Ru metal 108 will also be deposited on the surface 100a. However, in practice, although the Ru metal deposition is carried out for a duration that is shorter than the incubation time on the surface 100a, slight loss of selectivity may occur and unwanted additional Ru metal 108 may be deposited on the surface 100a. This loss of selectivity can, for example, be due to imperfections in the dielectric layer 100 or damage in the surface 100a due to earlier processing steps. This damage may at least in part be caused by a CMP planarization process that is utilized to prepare the planarized patterned substrate depicted in FIG. 1A, since typical CMP planarization processes use a corrosive process environment to achieve the desired removal of material from a patterned substrate.

Figure 5A:
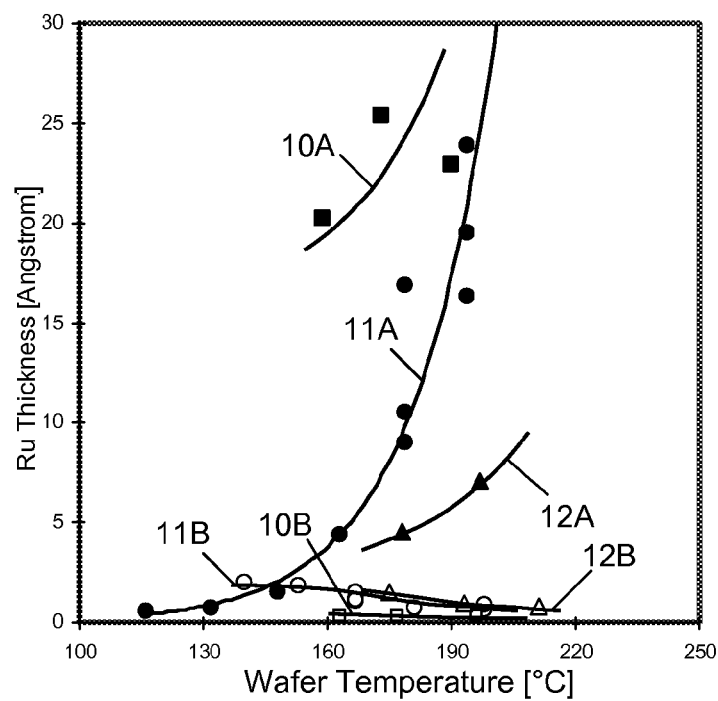
FIG. 5A shows thickness of Ru metal films deposited on wafer containing Cu metal and a low dielectric constant (low-k) material as a function of wafer temperature and process pressure.

FIG. 5A shows thickness of Ru metal films deposited on wafers containing Cu metal and Si-containing low-k material as a function of wafer temperature (in degrees C, ° C.) and process pressure in a process chamber for depositing the Ru metal film. The wafers containing either the Cu metal or the low-k material (k=2.4) were pre-treated prior to Ru metal deposition by heat-treating in H₂ gas for 1 min at a process pressure of 3 Torr. Following the pre-treating, the substrates were exposed to a process gas containing Ru₃(CO)₁₂ precursor vapor and CO gas for about 10 sec at substrate temperatures between about 115° C. and about 210° C. and process pressures of 500 mTorr, 100 mTorr, and 15 mTorr (milli-Torr). In a first example, traces 10A (trace data designated by solid squares) and 10B (trace data designated by open squares) show Ru metal thickness on Cu metal and low-k materials, respectively, for a process pressure in the process chamber of 15 mTorr. In a second example, traces 11A (trace data designated by solid circles) and 11B (trace data designated by open circles) show Ru thickness on Cu metal and low-k materials, respectively, for a process pressure of 100 mTorr. In a third example, traces 12A (trace data designated by solid triangles) and 12B (trace data designated by open triangles) show Ru thickness on Cu metal and low-k materials, respectively, for a process pressure of 500 mTorr. FIG. 5A shows that initial deposition of Ru metal directly on the Cu metal, as opposed to directly on the low-k material, is highly selective for wafer temperatures above about 150° C. and that the selectivity increases as a function of decreasing process pressure. This high selectivity can be used to deposit ultrathin (a few Angstrom thick) Ru metal films on Cu and other metals selective to dielectric materials.

Figure 5B:
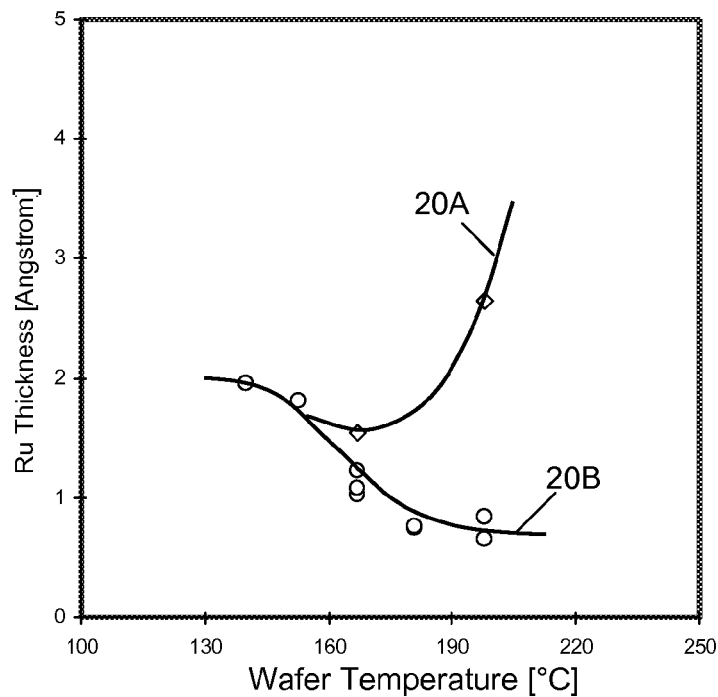
FIG. 5B shows thickness of Ru metal films deposited on a low-k material as a function of wafer temperature and pretreating conditions.

FIG. 5B shows thickness of Ru metal films deposited on a low-k material (k=2.4) as a function of wafer temperature and pre-treating conditions. The substrates were pre-treated prior to Ru metal deposition by heat-treating in H₂ gas with and without plasma exposure for 1 min at a process pressure of 3 Torr. The pre-treating was performed in a plasma process chamber containing a slotted plane antenna (SPA), as described in U.S. Pat. No. 5,024,716, entitled "Plasma processing apparatus for etching, ashing, and film-formation"; the contents of which are herein incorporated by reference in its entirety.

Following the pre-treating, the Ru metal films were deposited using a process gas containing Ru₃(CO)₁₂ precursor vapor and CO gas and process pressure of 100 mTorr. Trace 20A (trace data designated by open diamonds) shows Ru film thickness on substrates pre-treated with plasma excited H₂ gas and trace 20B (same as trace 10A in FIG. 5A; trace data designated by open circles) shows Ru film thickness on substrates pre-treated with H₂ gas without plasma excitation. FIG. 5B shows that pre-treating the low-k material with plasma excited H₂ gas significantly increases the initial Ru metal film deposition rate compared to substrates pre-treated with H₂ gas without plasma excitation. It is believed that the pre-treating with plasma excited H₂ gas activates an exposed surface of the low-k material, thereby reducing the incubation time for Ru metal deposition on the activated low-k material and reducing selectivity of the Ru metal deposition on the different low-k materials.

Adsorption of Ru₃(CO)₁₂ precursor vapor on a wafer (substrate) surface is thought to result in partial decomposition of the Ru₃(CO)₁₂ precursor to adsorbed Ru₃(CO)ₓ and CO species on the surface, followed by further decomposition of adsorbed Ru₃(CO)ₓ to Ru metal and CO that desorbs from the substrate.

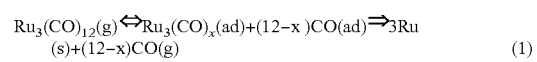

$$Ru_3(CO)_{12}(g) \leftrightarrow Ru_3(CO)_x(ad) + (12-x)CO(ad) \Rightarrow 3Ru(s) + (12-x)CO(g) \tag{1}$$

Although not wishing to be bound by theory, it is believed that the selective deposition of Ru metal observed on a metal surface such as Cu or tungsten (W) is at least in part due to higher concentration of adsorbed CO on dielectric surfaces than on the metal surface, thereby favoring recombination of adsorbed CO with $Ru_3(CO)_x$ to reform $Ru_3(CO)_{12}$ in Equation (1) on the dielectric surfaces. The lower concentration of adsorbed CO on metal surfaces leads to higher rate of decomposition of adsorbed $Ru_3(CO)_x$ to Ru metal and CO than on the dielectric surfaces.

Referring back to FIG. 1B, the current inventors have realized that although the presence of the first Ru metal 106 on the Cu metal layer surface 104a is extremely beneficial to the electromigration (EM) and stress migration (SM) properties of the Cu metal layer 104, the presence of even minute amounts of additional Ru metal 108 on the dielectric layer surface 100a is detrimental to the various electrical properties of the semiconductor device. As the minimum feature sizes of semiconductor devices decrease and the thickness of the dielectric layer 100 between adjacent Cu metal layers 104 decreases, these problems become increasingly more serious. In one example, a 32 nm minimum feature size device generation may utilize only about 45-50 nm dielectric thickness between adjacent Cu metal layers 104, and minute amounts of the additional Ru metal 108 on the surface 100a can create a current leakage path between the adjacent Cu metal layers 104, and strongly effect current (I)–voltage (V) and time-dependent-dielectric-breakdown (TDDB) behavior of the semiconductor device.

Figure 1C:
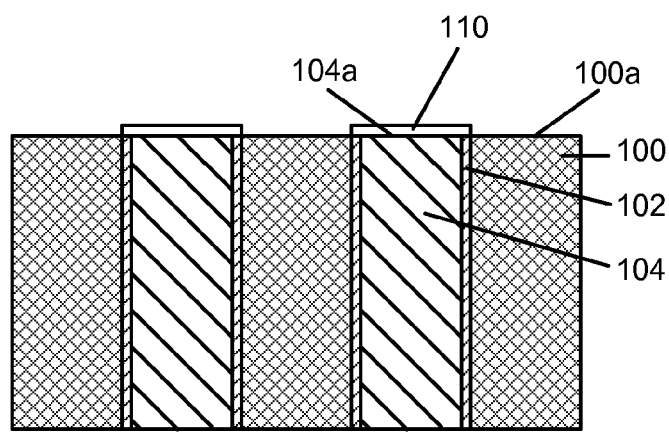

Still referring to FIG. 1B, according to embodiments of the invention, additional Ru metal 108 is at least substantially removed from the dielectric layer surface 100a and the first Ru metal 106 is partially removed or thinned on the Cu metal layer surface 104a to improve selective formation of a Ru metal cap layer 110 on the surface 104a relative to the surface 100a. The resulting patterned substrate is depicted in FIG. 1C. In various examples, an average thickness of the Ru metal cap layer 110 can be between 2 Angstrom and 100 Angstrom, for example about 2, 5, 10, 15, 20, 30, 40, 50, 60, 70, 80, 90, or 100 Angstrom. However, embodiments of the invention are not limited to those Ru metal cap layer 110 thicknesses and a thicker Ru metal cap layer 110 may be formed. For a very thin Ru metal cap layer 110, the surface coverage of the first Ru metal 106 on the surface 104a may be incomplete or discontinuous with gaps that expose the surface 104a.

According to one embodiment of the invention, the Ru metal removal process may be performed using a wet etching process. The wet etching process can, for example, include exposing the patterned substrate depicted in FIG. 1B to a wet etching solution. The wet etching solution may be selected from a wide variety of water-based etching solutions used in semiconductor manufacturing, including, but not limited to, HF(aq), buffered HF(aq), HCOOH (formic acid), $NH_3+H_2O$, $NH_3+H_2O_2+H_2O$, $HCl+H_2O$, $HCl+H_2O_2+H_2O$, or $H_2SO_4+H_2O_2+H_2O$, or a combination thereof. Exemplary wet etching times are between 5 seconds and 10 minutes and wet etching solution compositions (by volume) and temperatures may include: $HF+H_2O$ (1:100, 23° C.), $NH_3+H_2O_2+H_2O$ (1:1:20, 60° C.), or $HCl+H_2O_2+H_2O$ (1:1:20, 60° C.).

According to another embodiment of the invention, the Ru metal removal process may be performed using a brief chemical mechanical polishing (CMP) process. In one example, the same or similar CMP slurry solution may be used as in the earlier planarization step where excess Cu metal was removed from the patterned substrate. In one example, the CMP process time for may be very short for the Ru metal removal process (e.g., less than 10 seconds) compared to the Cu removal process. In other examples, CMP slurries optimized for barrier layer removal (e.g., TaN or Ta) or optimized for a Ru metal removal may be utilized.

According to yet another embodiment of the invention, the Ru metal removal process may be performed using a dry etching process. The dry etching process can, for example, include exposing the patterned substrate depicted in FIG. 1B to a halogen-containing etch gas or formic acid gas (HCOOH). The halogen-containing gas can, for example, contain $NF_3$ gas.

Figure 1D:
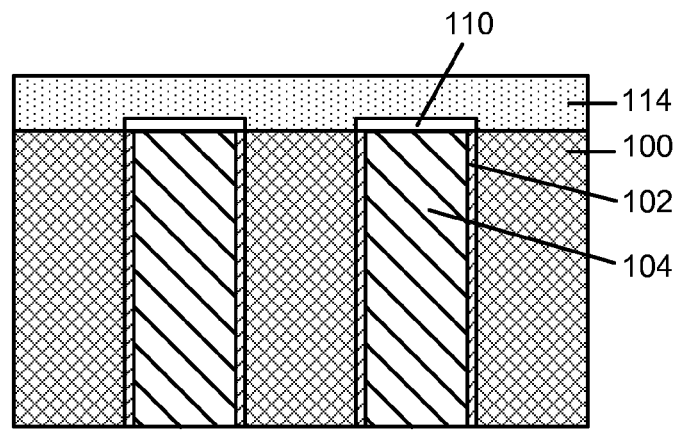

Following the formation of the Ru metal cap layer 110 depicted in FIG. 1C, the partially manufactured semiconductor device may be further processed. FIG. 1D shows dielectric diffusion barrier layer 114 formed on the Ru metal cap layer 110 and on the dielectric layer surface 100a. The dielectric diffusion barrier layer 114 can, for example, contain silicon nitride (SiN), silicon carbide (SiC), or silicon carbonitride (SiCN).

Figure 2A:
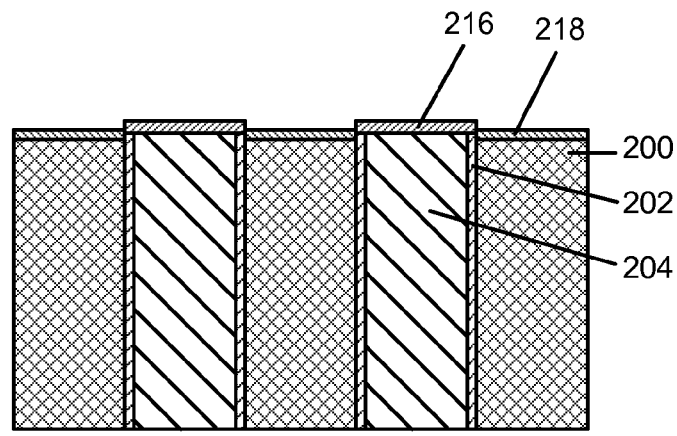
FIGS. 2A-2B show schematic cross-sectional views of formation of a modified Ru metal cap layer in Cu metallization of a semiconductor device according to another embodiment of the invention.
Figure 2B:
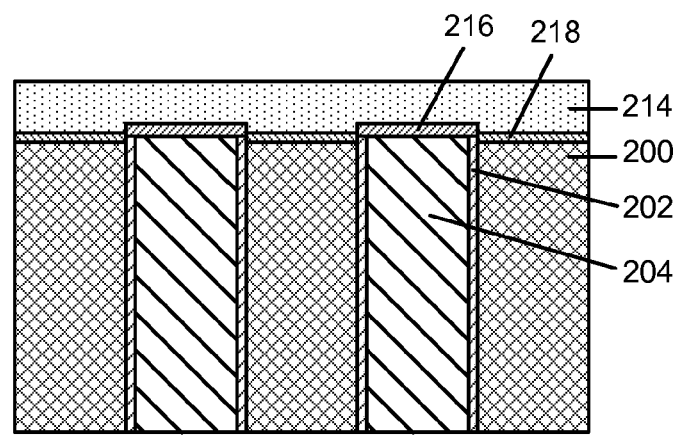

FIGS. 2A-2B show schematic cross-sectional views of formation of a modified Ru metal cap layer in Cu metallization of a semiconductor device according to another embodiment of the invention. FIG. 2A shows a patterned substrate containing a plurality of recessed features in a dielectric layer 200, a diffusion barrier layer 202 in a recessed feature, Cu metal layer 204 filling the recessed feature, a modified Ru metal cap layer 216, and a modified dielectric layer 218. According to one embodiment of the invention, the patterned substrate depicted in FIG. 1C may be modified to form the patterned substrate depicted in FIG. 2A, where at least a portion of the Ru metal cap layer 110 in FIG. 1C has been modified to form the modified Ru metal cap layer 216 in FIG. 2A with improved diffusion barrier properties for Cu metallization. The modifying process can further modify the dielectric layer surface 100a to form a modified dielectric layer 218.

Formation of the modified Ru metal cap layer 216 and the modified dielectric layer 218 can include incorporating one or more types of modifier elements into the Ru metal cap layer 110 and the dielectric layer surface 100a. The modified Ru metal cap layer 216 has improved barrier properties against Cu diffusion from the Cu metal layer 204 and the modified dielectric layer 218 is hardened relative to the dielectric layer 100. The one or more types of modifier elements may be selected from groups of elements in the Periodic Table of the Elements based on one or more barrier property enhancement parameters associated with the modifier elements. According to one embodiment of the invention, the modifying process can include exposing the Ru metal cap layer 110 and the dielectric layer surface 100a to a modifier gas comprising nitrogen (N), phosphor (P), or boron (B), or a combination thereof, to incorporate N, P, or B, or a combination thereof, into the Ru metal cap layer 110 and the dielectric layer surface 100a. The modifier gas can, for example, comprise $NH_3$, $PH_3$, $B_2H_6$, or a combination thereof.

Following the formation of the modified Ru metal cap layer 216, the partially manufactured semiconductor device depicted in FIG. 2A may be further processed. FIG. 2B shows a dielectric diffusion barrier layer 214 formed on the modified Ru metal cap layer 216 and the modified dielectric layer 218. The dielectric diffusion barrier layer 214 can, for example, contain silicon nitride (SiN), silicon carbide (SiC), or silicon carbonitride (SiCN). According to other embodiments of the invention, the diffusion barrier layer 214 may be omitted and the modified Ru metal cap layer 216 and the modified dielectric layer 218 may be used as diffusion barriers for further metallization layers.

Figure 3A:
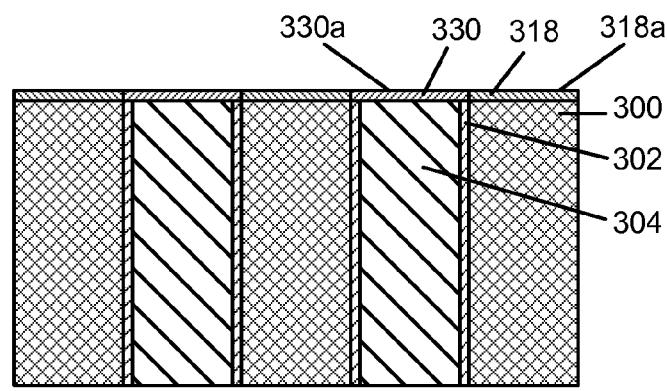
FIGS. 3A-3D show schematic cross-sectional views of formation of a Ru metal cap layer in Cu metallization of a semiconductor device according to yet another embodiment of the invention.

FIGS. 3A-3D show schematic cross-sectional views of formation of a Ru metal cap layer in Cu metallization of a semiconductor device according to yet another embodiment of the invention. FIG. 3A shows a patterned substrate containing a plurality of recessed features in a dielectric layer 300, a diffusion barrier layer 302 in a recessed feature, Cu metal layer 304, modified Cu metal layer 330 having a modified Cu metal layer surface 330a, and modified dielectric layer 318 having a modified dielectric layer surface 318a.

According to one embodiment of the invention, the patterned substrate depicted in FIG. 1A may be modified to form the patterned substrate depicted in FIG. 3A. The modifying process can include incorporating one or more types of modifier elements into the Cu metal layer 104 and the dielectric layer surface 100a. The one or more types of modifier elements may be selected from groups of elements in the Periodic Table of the Elements based on one or more barrier property enhancement parameters associated with the modifier elements. According to one embodiment of the invention, the modifying process can include exposing the Cu metal layer surface 104a and the dielectric layer surface 100a to a modifier gas comprising nitrogen (N), phosphor (P), or boron (B), or a combination thereof, to incorporate N, P, or B, or a combination thereof, into the Cu metal layer 104 and the dielectric layer surface 100a. The modifier gas can, for example, comprise $NH_3$, $PH_3$, or $B_2H_6$, or a combination thereof.

According to one embodiment of the invention, the modifying process to form the substrate depicted in FIG. 3A may include heat-treating the patterned substrate depicted in FIG. 1A in the presence of $H_2$, $N_2$, or $NH_3$, or a combination thereof. The heat-treating can be performed at a substrate temperature below 200° C. and may further include a noble gas such as argon (Ar). Alternately, the heat-treating can be performed at a substrate temperature between 200° C. and 400° C. In one example, pure $H_2$, pure $N_2$, or pure $NH_3$ may be used. In another example, the $H_2$, $N_2$, or $NH_3$, or combination thereof, may further contain a noble gas such as argon (Ar). In one example, a 10:1 $H_2$/Ar mixture may be used.

According to another embodiment of the invention, the heat-treating may be performed at a substrate temperature below 200° C. in the presence of $H_2$. In one example pure $H_2$ may be used. In another example, a mixture of $H_2$ and Ar may be used.

According to yet another embodiment of the invention, the heat-treating may be performed at a substrate temperature below 200° C. in the presence of $N_2$ or $NH_3$, or a combination thereof. In one example pure $N_2$ or pure $NH_3$ may be used. In another example, a mixture of $N_2$ and Ar, or $NH_3$ and Ar, or $N_2$, $NH_3$, and Ar may be used.

Figure 3B:
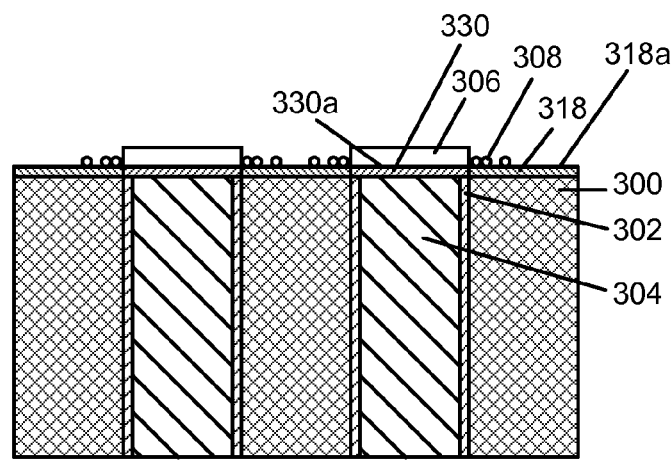

FIG. 3B shows first Ru metal 306 deposited on the modified Cu metal layer surface 330a and additional Ru metal 308 deposited on the modified dielectric layer surface 318a. According to one embodiment of the invention, the first Ru metal 306 and the additional Ru metal 308 may be deposited in a thermal chemical vapor deposition (TCVD) process without the use of a plasma using a process gas containing $Ru_3(CO)_{12}$ precursor vapor and CO carrier gas. In another example, the first Ru metal 306 and the additional Ru metal 308 may be deposited by a CVD process utilizing a ruthenium metalorganic precursor. In one example, an average thickness of the first Ru metal 306 can be between 5 Angstrom ($10^{-10}$ m) and 100 Angstrom, for example about 5, 10, 15, 20, 30, 40, 50, 60, 70, 80, 90, or 100 Angstrom.

For very thin first Ru metal 306, for example about between 5 Angstrom and 20 Angstrom, the surface coverage of the first Ru metal 306 on the modified Cu metal layer surface 330a may be incomplete or discontinuous with gaps that expose the surface 330a. According to one embodiment of the invention, the amount of the additional Ru metal 308 is less than the amount of the first Ru metal 306. According to one embodiment of the invention, an average thickness of the first Ru metal 306 is greater than the average thickness of the additional Ru metal 308. Further, as depicted in FIG. 3B, the surface coverage of additional Ru metal 308 on the modified dielectric layer surface 318a may be incomplete or discontinuous with gaps that expose the surface 318a. In other embodiments, the surface coverage of both the first Ru metal 306 and the additional Ru metal 308 may be complete or continuous with no exposed gaps, where the thickness of the first Ru metal 306 is greater than the thickness of the additional Ru metal 308.

As depicted in FIG. 3B, deposition of the first Ru metal 306 on the modified Cu metal layer surface 330a can be substantially selective relative to the modified dielectric layer surface 318a. In other words, Ru metal is preferentially deposited on the modified Cu metal surface 330a compared to on the modified dielectric layer surface 318a. Therefore, deposition rate of the first Ru metal 306 on the modified Cu metal layer surface 330a is higher than deposition rate of the additional Ru metal 308 on the modified dielectric layer surface 318a. Deposition of the additional Ru metal 308 can proceed by loss of deposition selectivity on the modified Cu metal surface 300a relative to the dielectric layer surface 318a during depositing of the first Ru metal 106.

Figure 3C:
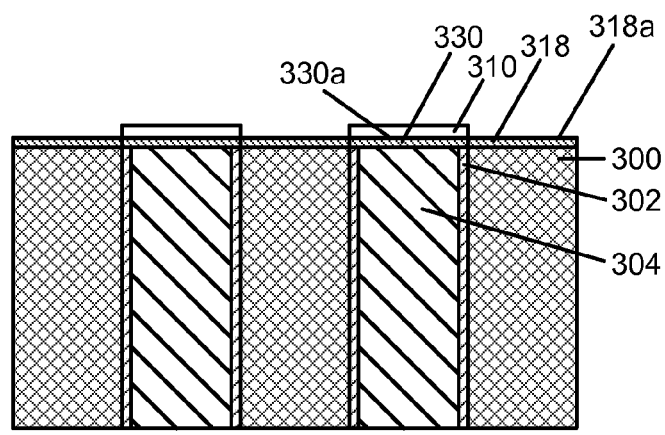

Following the Ru metal deposition depicted in FIG. 3B, the additional Ru metal 308 is at least substantially removed from the modified dielectric layer surface 318a and the first Ru metal 306 is partially removed or thinned on the modified Cu metal layer surface 330a to improve the selective formation of a Ru metal cap layer 310 on the surface 330a. The resulting patterned substrate is depicted in FIG. 3C. In one example, an average thickness of the Ru metal cap layer 310 can be between 2 Angstrom and 100 Angstrom, for example about 2, 5, 10, 15, 20, 30, 40, 50, 60, 70, 80, 90, or 100 Angstrom. For very thin Ru metal cap layer 310, the surface coverage of the Ru metal cap layer 310 on the surface 330a may be incomplete or discontinuous with gaps that expose the surface 330a.

According to one embodiment of the invention, the Ru metal removal process may be performed using a wet etching process. The wet etching process can, for example, include exposing the patterned substrate depicted in FIG. 3B to a wet etching solution. The wet etching solution may be selected from a wide variety of water-based etching solutions used in semiconductor manufacturing, including, but not limited to, HF(aq), buffered HF(aq), HCOOH (formic acid), $NH_3+H_2O$, $NH_3+H_2O_2+H_2O$, $HCl+H_2O$, $HCl+H_2O_2+H_2O$, or $H_2SO_4+H_2O_2+H_2O$, or a combination thereof. Exemplary wet etching times are between 5 seconds and 10 minutes and wet etching solution compositions (by volume) and temperatures may include: $HF+H_2O$ (1:100, 23° C.), $NH_3+H_2O_2+H_2O$ (1:1:20, 60° C.), or $HCl+H_2O_2+H_2O$ (1:1:20, 60° C.).

According to another embodiment of the invention, the Ru metal removal process may be performed using a brief chemical mechanical polishing (CMP) process. In one example, the same or similar CMP slurry solution may be used as in the earlier planarization step where excess Cu metal was removed from the patterned substrate. In one example, the CMP process time for may be very short for the Ru metal removal process (e.g., less than 10 seconds) compared to the Cu removal process. In other examples, a CMP slurry optimized for barrier layer removal (e.g., TaN or Ta) or optimized for a Ru metal removal may be utilized.

According to yet another embodiment of the invention, the Ru metal removal process may be performed using a dry etching process. The dry etching process can, for example, include exposing the patterned substrate depicted in FIG. 3B to a halogen-containing etch gas or HCOOH gas. The halogen-containing gas can, for example, contain $NF_3$ gas.

Figure 3D:
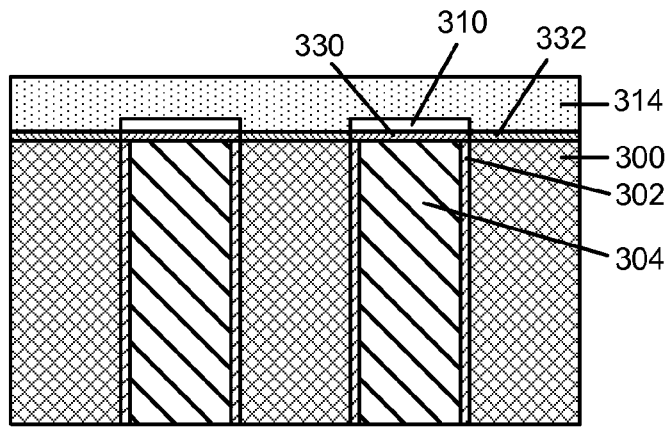

Following the formation of the Ru metal cap layer 310, the partially manufactured semiconductor device depicted in FIG. 3C may be further processed. FIG. 3D shows a dielectric diffusion barrier layer 314 formed on the Ru metal cap layer 310 and the modified dielectric layer 318. The dielectric diffusion barrier layer 314 can, for example, contain silicon nitride (SiN), silicon carbide (SiC), or silicon carbonitride (SiCN).

Figure 4A:
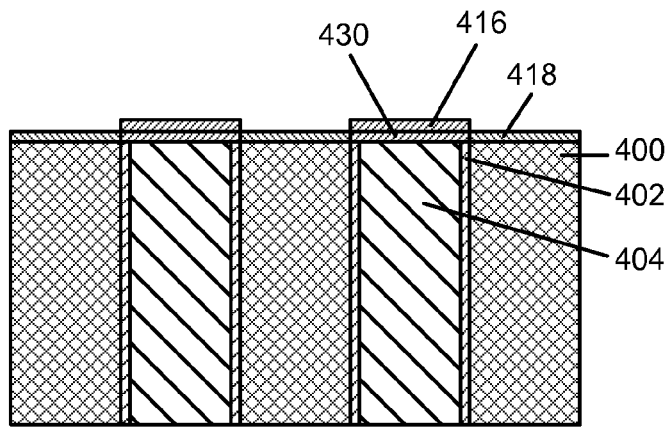
FIGS. 4A-4B show schematic cross-sectional views of formation of a modified Ru metal cap layer in Cu metallization of a semiconductor device according to still another embodiment of the invention.
Figure 4B:
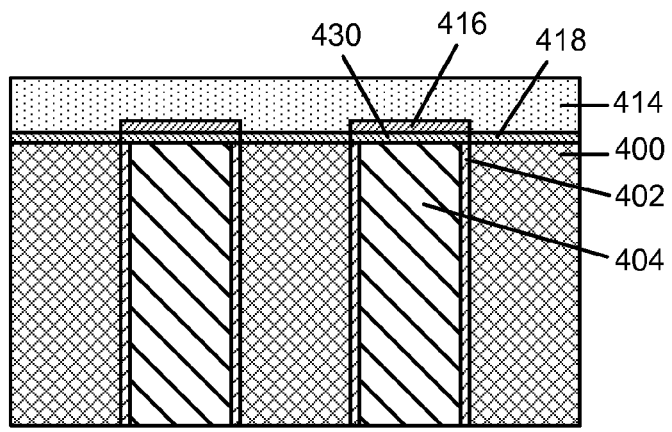

FIGS. 4A-4B show schematic cross-sectional views of formation of a Ru-containing cap layer in Cu metallization of a semiconductor device according to still another embodiment of the invention. FIG. 4A shows a patterned substrate containing a plurality of recessed features in a dielectric layer 400, a diffusion barrier layer 402 in a recessed feature, a Cu metal layer 404, a modified Cu metal layer 430, a modified dielectric layer 418, and modified Ru metal cap layer 416.

Referring back to FIG. 3C, according to one embodiment of the invention, at least a portion of the Ru metal cap layer 310 may be modified to form the modified Ru metal cap layer 416 depicted in FIG. 4A. The modifying process can include incorporating one or more types of modifier elements into the Ru metal cap layer 310 to form the modified Ru metal cap layer 416. The one or more types of modifier elements may be selected from the Periodic Table of the Elements based on one or more barrier property enhancement parameters associated with the modifier elements. According to one embodiment of the invention, the modifying process can include exposing the Ru metal cap layer 310 to a modifier gas comprising nitrogen (N), phosphor (P), or boron (B), or a combination thereof, to incorporate N, P, or B, or a combination thereof, into the Ru metal cap layer 310. The modifier gas can, for example, comprise $NH_3$, $PH_3$, or $B_2H_6$, or a combination thereof.

Following the formation of the modified Ru metal cap layer 416, the partially manufactured semiconductor device depicted in FIG. 4A may be further processed. FIG. 4B shows a dielectric diffusion barrier layer 414 formed on the modified Ru metal cap layer 416 and on the modified dielectric layer 418. The dielectric diffusion barrier layer 414 can, for example, contain silicon nitride (SiN), silicon carbide (SiC), or silicon carbonitride (SiCN). According to other embodiments of the invention, the dielectric diffusion barrier layer 414 may be omitted and the modified Ru metal cap layer 416 and the modified dielectric layer 418 may be used as a diffusion barrier for further metallization layers.

A plurality of embodiments for integrating Ru metal cap layers and modified Ru metal cap layers into manufacturing of semiconductor devices to improve electromigration (EM) and stress migration (SM) in Cu metallization has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a planarized patterned substrate containing a copper (Cu) metal surface and a dielectric layer surface;
   depositing a first ruthenium (Ru) metal on the Cu metal layer surface;
   depositing additional Ru metal directly on the dielectric layer surface during the depositing of the first Ru metal, wherein the amount of the additional Ru metal is less than the amount of the first Ru metal; and
   at least substantially etching the additional Ru metal from the dielectric layer surface to selectively form a Ru metal cap layer on the Cu metal layer surface and not on the dielectric layer surface, wherein the etching comprises a dry etching process that exposes the additional Ru metal to a halogen-containing etch gas containing $NF_3$ gas.

2. The method of claim 1, wherein surface coverage of the deposited additional Ru metal is discontinuous on the dielectric layer surface.

3. The method of claim 1, wherein deposition rate of the first Ru metal on the Cu metal layer surface is higher than deposition rate of the additional Ru metal on the dielectric layer surface.

4. The method of claim 1, wherein depositing the additional Ru metal proceeds by loss of deposition selectivity on the Cu metal layer surface relative to the dielectric layer surface during depositing of the first Ru metal.

5. The method of claim 1, further comprising depositing a dielectric diffusion barrier layer on the Ru metal cap layer and on the dielectric layer surface.

6. The method of claim 1, further comprising:
   forming a modified Ru metal cap layer and a modified dielectric layer by incorporating one or more types of modifier elements into the Ru metal cap layer and the dielectric layer surface, the one or more types of modifier elements being selected from groups of elements in the Periodic Table of the Elements based on one or more barrier property enhancement parameters associated with the modifier elements.

7. The method of claim 6, wherein the one or more types of modifier elements comprise nitrogen, phosphor, boron, or a combination thereof.

8. The method of claim 6, wherein forming the modified Ru metal cap layer comprises:
   exposing the Ru metal cap layer and the dielectric layer surface to a modifier gas comprising nitrogen, phosphor, or boron, or a combination thereof.

9. The method of claim 8, wherein the modifier gas comprises $NH_3$, $PH_3$, or $B_2H_6$, or a combination thereof.

10. The method of claim 6, further comprising:
    depositing a dielectric diffusion barrier layer on the modified Ru metal cap layer and on the modified dielectric layer.

11. A method of forming a semiconductor device, comprising:
    providing a planarized patterned substrate containing a copper (Cu) metal surface and a dielectric layer surface;
    forming a modified Cu metal layer surface and a modified dielectric layer surface by incorporating one or more types of modifier elements into the Cu metal layer surface and the dielectric layer surface, the one or more types of modifier element being selected from groups of elements in the Periodic Table of the Elements based on one or more barrier property enhancement parameters associated with the modifier elements;

depositing a first ruthenium (Ru) metal on the modified Cu metal layer surface;

depositing additional Ru metal directly on the modified dielectric layer surface during the depositing of the first Ru metal, wherein the amount of the additional Ru metal is less than the amount of the first Ru metal; and at least substantially etching the additional Ru metal from the modified dielectric layer surface to selectively form a Ru metal cap layer on the modified Cu metal layer surface and not on the modified dielectric layer surface, wherein the etching comprises a dry etching process that exposes the additional Ru metal to a halogen-containing etch gas containing $NF_3$ gas.

12. The method of claim 11, wherein surface coverage of the deposited additional Ru metal is discontinuous on the modified dielectric layer surface.

13. The method of claim 11, wherein deposition rate of the first Ru metal on the modified Cu metal layer surface is higher than deposition rate of the additional Ru metal on the modified dielectric layer surface.

14. The method of claim 11, wherein depositing the additional Ru metal on the dielectric layer surface proceeds by loss of deposition selectivity on the Cu metal layer surface relative to the dielectric layer surface during depositing of the first Ru metal.

15. The method of claim 11, wherein the one or more types of modifier elements comprise nitrogen, phosphor, boron, or a combination thereof.

16. The method of claim 11, wherein the incorporating comprises exposing the Cu metal layer surface and the dielectric layer surface to a modifier gas to containing nitrogen, phosphor, or boron, or a combination thereof.

17. The method of claim 16, wherein the modifier gas comprises $NH_3$, $PH_3$, or $B_2H_6$, or a combination thereof.

18. The method of claim 11, wherein forming the modified Cu metal layer surface and the modified dielectric layer surface comprises heat-treating the Cu metal surface and the dielectric layer surface in the presence of $H_2$, $N_2$, or $NH_3$, or a combination thereof.

19. The method of claim 11, further comprising:

depositing a dielectric diffusion barrier layer on the Ru metal cap layer and on the modified dielectric layer surface.

20. The method of claim 11, further comprising:

forming a modified Ru metal cap layer by incorporating one or more types of modifier elements into the Ru metal cap layer, the one or more types of modifier elements being selected from groups of elements in the Periodic Table of the Elements based on one or more barrier property parameters associated with the modifier elements.

21. The method of claim 20, wherein the one or more types of modifier elements comprise nitrogen, phosphor, boron, or a combination thereof.

22. The method of claim 20, wherein forming the modified Ru metal cap layer comprises:

exposing the Ru metal cap layer to a modifier gas comprising nitrogen, phosphor, or boron, or a combination thereof.

23. The method of claim 22, wherein the modifier gas comprises $NH_3$, $PH_3$, or $B_2H_6$, or a combination thereof.

24. The method of claim 20, further comprising:

depositing a dielectric diffusion barrier layer on the modified Ru metal cap layer and on the modified dielectric layer surface.

* * * * *